United States Patent [19]

Kleveland et al.

[11] Patent Number: 5,969,929
[45] Date of Patent: Oct. 19, 1999

[54] DISTRIBUTED ESD PROTECTION DEVICE FOR HIGH SPEED INTEGRATED CIRCUITS

[75] Inventors: Bendik Kleveland, Los Altos; Thomas H. Lee, Cupertino, both of Calif.

[73] Assignee: The Board of Trustees of the Leland Stanford Junior University, Palo Alto, Calif.

[21] Appl. No.: 09/058,588

[22] Filed: Apr. 10, 1998

Related U.S. Application Data

[60] Provisional application No. 60/043,244, Apr. 16, 1997.

[51] Int. Cl.$^6$ ........................................... H02H 3/22
[52] U.S. Cl. .............................. 361/111; 361/56
[58] Field of Search ......................... 361/56, 91, 111, 361/58

[56] References Cited

U.S. PATENT DOCUMENTS

| | | | |
|---|---|---|---|
| 4,876,584 | 10/1989 | Taylor | 357/23.13 |
| 4,989,057 | 1/1991 | Lu | 357/23.7 |
| 4,996,626 | 2/1991 | Say | 361/91 |
| 5,079,612 | 1/1992 | Takamoto et al. | 361/91 |
| 5,301,081 | 4/1994 | Podell et al. | 361/56 |
| 5,335,134 | 8/1994 | Stein et al. | 361/56 |
| 5,532,896 | 7/1996 | Coussens et al. | 361/56 |
| 5,619,061 | 4/1997 | Goldsmith et al. | 257/528 |
| 5,689,133 | 11/1997 | Li et al. | 257/361 |
| 5,771,444 | 6/1998 | Dent et al. | 455/127 |
| 5,781,389 | 7/1998 | Fukuzako et al. | 361/56 |

OTHER PUBLICATIONS

Bock, "ESD Issues in Compound Semiconductor High–Frequency Devices and Circuits", *EOS/ESD Symposium*, pp. 1–12 (1997).

Majidi–Ahy et al., "5–100 GHz InP Coplanar Waveguide MMIC Distributed Amplifier", *IEEE Transactions on Microwave Theory and Techniques*, 38(12):1986–1994 (1990).

Maloney, "Designing MOS Inputs and Outputs to Avoid Oxide Failure in the Charged Device Model", *EOS/ESD Symposium Proceedings*, pp.220–227 (1988).

Sullivan et al., "An Integrated CMOS Distributed Amplifier Utilizing Packaging Inductance", *IEEE Transactions on Microwave Theory and Techniques*, 45(10):1969–1977 (1997).

van der Weide, "Delta–Doped Schottky Diode Nonlinear Transmission Lines for 480–fs, 3.5–V Transients", *Appl. Phys. Lett.*, 65(7):881–883 (1994).

*Primary Examiner*—Michael J. Sherry
*Attorney, Agent, or Firm*—Flehr Hohbach Test Albritton & Herbert LLP

[57] ABSTRACT

A distributed electrostatic discharge (ESD) protection circuit for high frequency integrated circuits. A transmission line from an integrated circuit (IC) pad or package pin couples a plurality of ESD elements. The ESD elements, such as diodes, are distributed along the transmission line and coupled from the transmission line to ground or a power supply. The effective impedance of the transmission line and ESD elements is defined to match the impedance of an external line. Distributed ESD protection circuits provide a high frequency signal path that can be used well into the GHz frequency range and also provide effective ESD protection.

21 Claims, 7 Drawing Sheets

MICROSTRIP TRANSMISSION LINE

FIG. 4A

COPLANAR WAVEGUIDE

FIG. 4B

COPLANAR STRIPLINE

DISTRIBUTED ESD PROTECTION DEVICE FOR HIGH SPEED INTEGRATED CIRCUITS

The present application claims priority to Provisional Application Ser. No. 60/043,244 filed Apr. 16, 1997.

BRIEF DESCRIPTION OF THE INVENTION

The present invention relates generally to integrated circuits, and more particularly to a device for protecting high speed integrated circuits from electrostatic discharge.

BACKGROUND OF THE INVENTION

Electrostatic discharge (ESD) occurs when large voltage pulses due to static electricity occur at the leads of an integrated circuit (IC). These large voltage pulses can cause the breakdown of insulating layers, short circuiting between conducting paths, or overheating or evaporation of metal or silicon pathways within the IC leading to the failure of the IC. Increases in IC density have reduced the width of IC traces and the gate dielectric thickness of active devices which have made ICs more susceptible to damage from ESD events.

Figure 1:
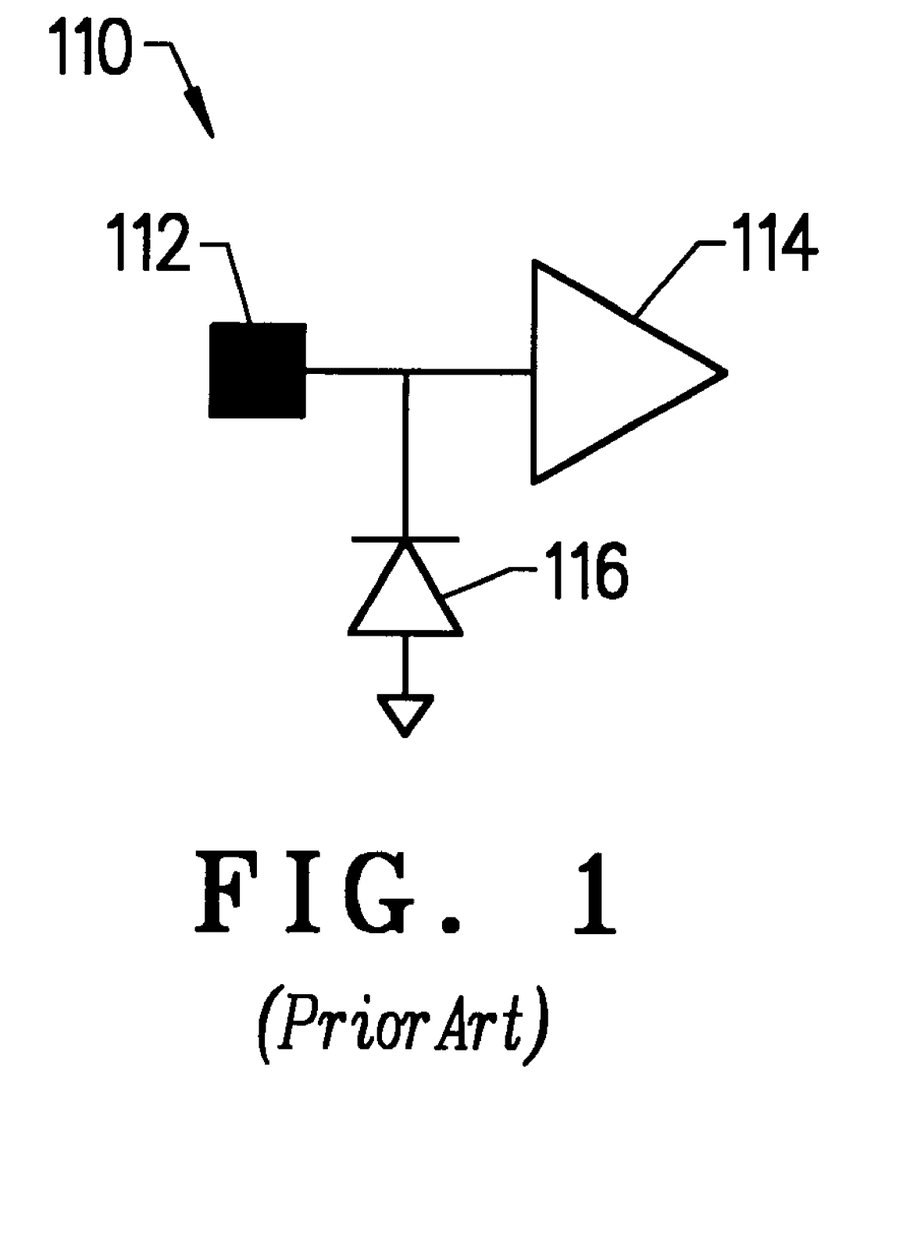
FIG. 1 illustrates an input pin with a conventional ESD protection device.

During the processing and handling of individual packaged ICs, circuits connected to external pins, or external bumps in some IC packages, can be exposed to very high voltages. Peripheral circuits therefore use special electrostatic discharge (ESD) protection circuits coupled to external pins. An input pin 112 with a conventional ESD protection device 116 and a buffer 114 is illustrated in FIG. 1. The ESD protection device 116 is a diode coupled to ground. Voltages above the breakdown voltage effectively short diode 116 and are thereby shunted to ground.

The continuous scaling of integrated circuits has enabled a rapid increase in IC operating frequencies. The parasitic capacitance of ESD protection circuits slows signals down and has made ESD circuits a major bottleneck for high-speed operation. In narrow-band designs, this capacitance can be resonated out with a package/bondwire inductance, and thereby circumvented. However, this approach is not applicable to broadband designs, and therefore the parasitic capacitance of ESD circuits continues to be a problem in conventional broadband designs. In high frequency ICs ESD devices are typically located as close to the input/output pads as possible. There are generally strict guidelines for the minimum metal width and the maximum distance from the ESD protection to the pads in order to minimize the voltage drop in the metal lines. Even slight non-uniformities in the via placement in ESD structures can cause severe performance degradation. This placement creates a large lumped capacitance due to the ESD protection at the pad. The ESD parasitic load becomes a significant problem around 1–2 GHz of operation; the reactance of the capacitance of a typical ESD protection circuit (1–2 pF) is almost as low as a 50 ohm transmission line. Therefore a significant part of the signal is lost through the ESD circuit. It is very difficult to make a resistive termination with such a large capacitive load. As a result, high frequency devices often do not include any ESD protection.

High frequency instruments using circuits without ESD protection require special care in order not to destroy the input buffers. Special grounding of operators/probes are usually required since the input circuits generally either have insufficient ESD protection or no ESD protection at all. The input circuits of high-frequency instruments such as spectrum and network analyzers are particularly susceptible to ESD damage. As a result manufacturers typically make the input circuits easily replaceable. As the market for high frequency devices grows and as the operating frequencies of ICs continue to increase, protecting against ESD damage becomes increasingly important.

There is therefore a need for an improved ESD protection device with a sufficiently low parasitic capacitance to avoid reducing the bandwidth of high frequency devices.

SUMMARY OF THE INVENTION

The present invention provides a distributed electrostatic discharge (ESD) protection circuit for high frequency integrated circuits. In one embodiment a transmission line from an integrated circuit (IC) pad couples a plurality of ESD elements. The ESD elements are distributed along the transmission line and coupled from the transmission line to ground. The effective impedance of the transmission line and ESD elements is designed to match the impedance of an external line.

Numerous devices may be used for the ESD elements including, for example, diodes, MOS transistors, and CMOS output drivers. The transmission line that couples the ESD elements can be fabricated as part of the IC die, or can be made part of the IC package. Transmission lines fabricated on the IC die or as traces in the IC package may be formed as microstrip transmission lines, coplanar waveguides, or coplanar striplines. On-chip transmission line elements may also be formed from circuit traces configured as spiral inductors.

The distributed ESD protection circuits of the present invention provides a large device for ESD protection, and a small effective capacitance for high speed circuit operation. The distributed ESD protection circuits provide a high frequency signal path that can be used well into the gigahertz frequency range. The present invention also reduces the effect of voltage dependent changes in the depletion capacitance, and thereby can be used to extend the accuracy as well as the bandwidth of analog circuits such as analog to digital converters.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 2A:
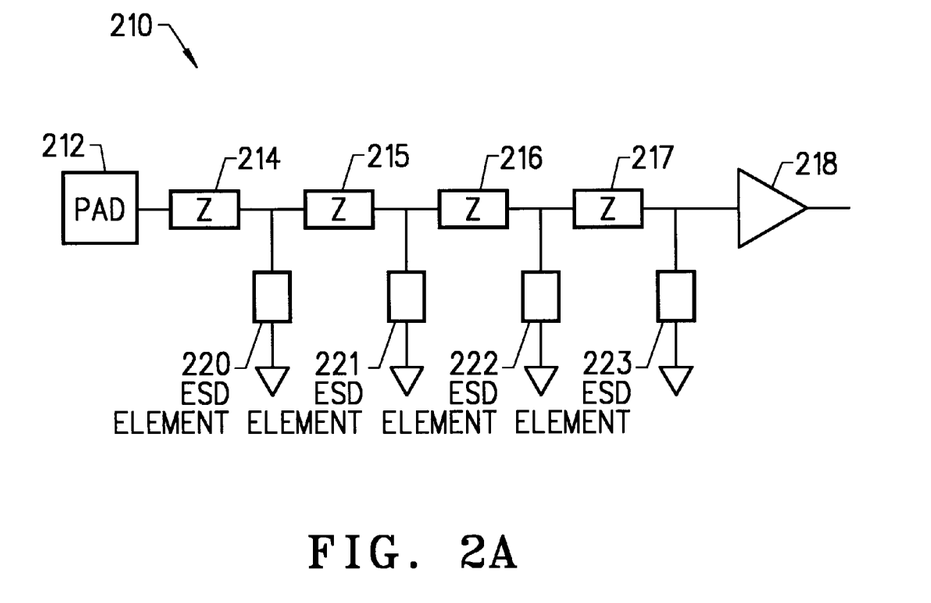
FIG. 2A illustrates a distributed ESD protection circuit 210 according to an embodiment of the present invention.

Referring to FIG. 2A, circuit 210 illustrates a distributed ESD protection circuit according to one embodiment of the present invention. ESD circuit 210 includes a pad 212, four impedance components 214–217, four ESD elements 220–223, and an input buffer 218. In order to maintain a high bandwidth for the circuit, the ESD protection is distributed and connected with on-chip or on-package impedance elements. Each ESD component is formed by an impedance element and an ESD element which is coupled to ground. FIG. 2A illustrates an ESD protection circuit with four ESD components; the number of ESD components can be varied to optimize design performance. ESD protection circuit 210 is shown at an input pin; as is well known by those of ordinary skill in the art, the present invention can also be used on output pins or as a termination.

Figure 2B:
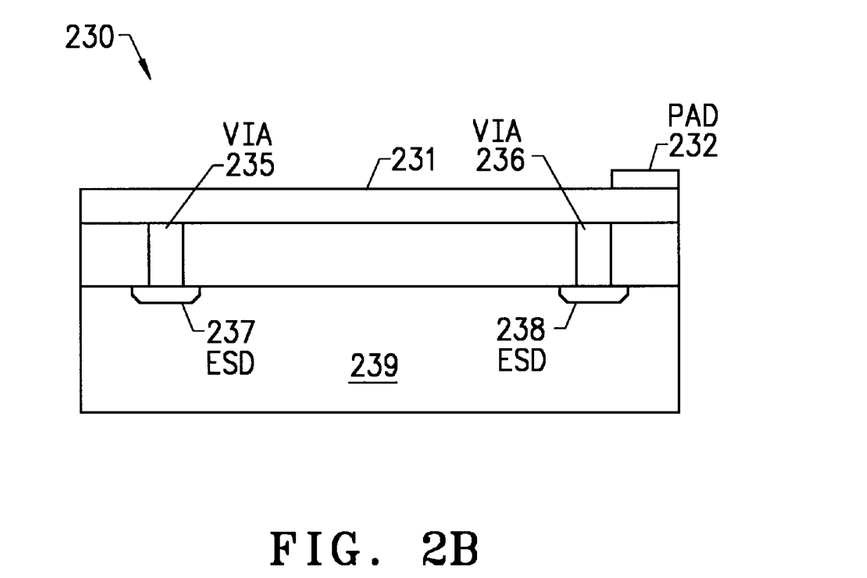
FIG. 2B illustrates a cross section of a distributed ESD protection device 230.

FIG. 2B illustrates a cross section of a distributed ESD protection device 230. ESD protection device 230 includes a pad 232, a metal layer transmission line 231, two metal vias 235 and 236, two junctions 237 and 238, and a silicon substrate 239. The two junctions 237 and 238 form diodes with substrate 239 and are thus ESD elements. High voltage injected into an IC can break down field oxide as well as gate oxide, therefore it is generally important to place ESD protection devices close to the device pads. To reduce the electric field across the field oxide, one embodiment uses only the top level metal layer for the transmission line elements. This provides a large distance between the metal layer transmission line 231 and the substrate 239 which reduces the electric field. Reducing the electric field can, in some embodiments, facilitate distributing the ESD capacitance into a wide-bandwidth transmission line where the effective impedance, $Z_{effective}$, is:

$$Z_{effective} = \sqrt{\frac{L}{C_{total}}}$$

The capacitance of the ESD device can therefore be part of the transmission line, and it minimally degrades the bandwidth of the signal. As is known by those of ordinary skill in the art, a common test for ESD protection devices is the Human Body Model (HBM) which is typically a 2 kV voltage injected from a 100 pF load through a 1.5 kohm resistor. Another common test for ESD protection is the Charged Device Model (CDM) which is 1 kV injected through a very low impedance. The CDM discharge path is through an external 1 ohm resistor and inductor coupled in series to ground. The inductor is less than approximately 10 nH. The distributed ESD protection circuits of the present invention can provide ESD protection to surpass both the HBM and CDM requirements.

With an advanced IC package, such as the C4 package type, that uses solder bumps to couple external connections to the IC die, the ESD protection circuit can be distributed between solder bumps which are interconnected by a low loss IC package transmission line.

Junctions 237 and 238 have an associated depletion capacitance. When a voltage is applied to the junction, it generates a depletion region around the junction which in turn affects the capacitance. The depletion capacitance is inversely proportional to the distance across the depletion region. Therefore increasing the voltage across the junction decreases the depletion capacitance. The voltage dependence of the depletion capacitance is a source of error for devices with analog inputs such as analog to digital converters. Placing a distributed ESD protection device according to the present invention at an input adds the transmission line capacitance to the input capacitance. The transmission line capacitance does not vary with input voltage. Therefore the transmission line capacitance reduces the effect of voltage dependent changes in the depletion capacitance.

Distributed ESD protection devices according to the present invention may also provide improved heat dissipation performance for non-silicon integrated circuits such as gallium arsenide. Gallium arsenide circuits generally are highly vulnerable to ESD discharge. One reason for this is that gallium arsenide circuits dissipate heat poorly and therefore the heat generated in an ESD event accelerates damage to the IC rather than being dissipated in the substrate. The distributed nature of the present invention ESD protection circuits may improve the heat dissipation of gallium arsenide ICs and thereby provide a further advantage over conventional lumped ESD protection devices.

A distributed design in accordance with the present invention decouples the low-frequency ESD requirements from the high-frequency performance specifications. The present invention can be used to maintain the total load of a conventional ESD protection design, but the present invention distributes the load over a larger area. As is known by those of ordinary skill in the art there are many ways of distributing the ESD capacitance including for example, using distributed diodes, MOS transistors, or silicon controlled rectifiers.

Figure 2C:
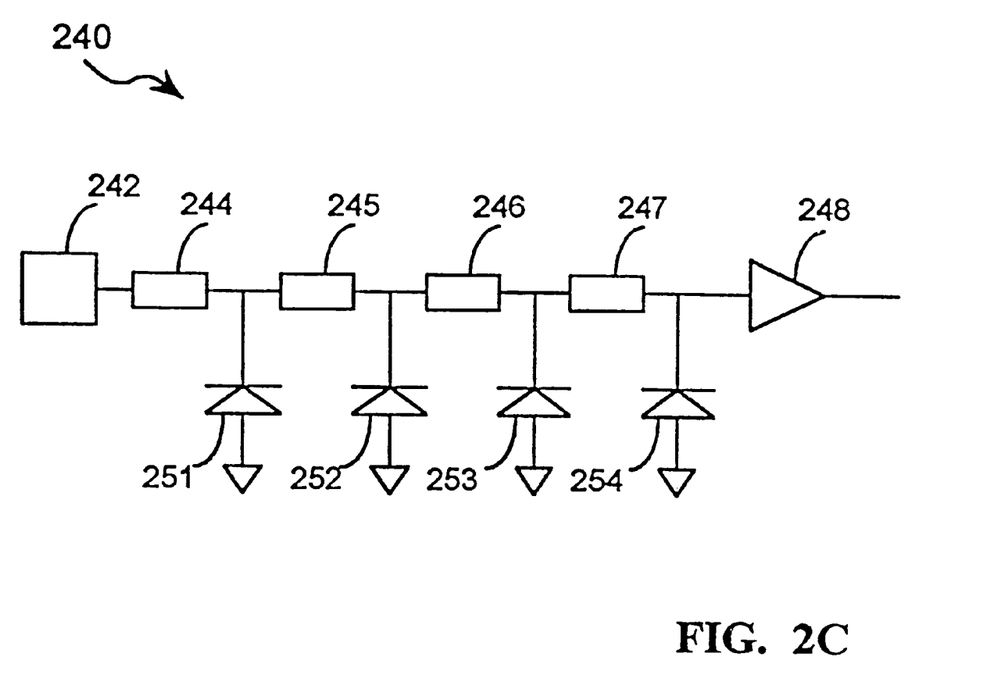
FIG. 2C illustrates a distributed ESD protection circuit 240 that uses diode ESD elements according to an embodiment of the present invention.

FIG. 2C illustrates a distributed ESD protection circuit 240 that uses diode ESD elements. ESD circuit 240 includes a pad 242, four transmission line elements 244–247, four diodes 251–254, and a buffer 248. The four diodes 251–254 are each coupled between a transmission line element and ground. The transmission line should have a characteristic impedance larger than the target effective impedance, $Z_{effective}$, because the effect of the ESD protection is to reduce the effective impedance according to the formula:

$$Z_{effective} = \sqrt{\frac{L_{line}}{C_{line} + C_{esd}}}$$

where $L_{line}$ is the transmission line inductance, $C_{line}$ is the transmission line capacitance, and $C_{esd}$ is the ESD element capacitance. A frequently used target impedance is 50 ohms. As indicated by the above equation for $Z_{effective}$, with a sufficiently low loss transmission line, ESD protection circuit 240 can provide strong ESD protection (high $C_{esd}$) and meet the target impedance. The transmission line, comprising elements 244–247, provides a high bandwidth signal path.

The on-chip distributed ESD protection devices of the present invention effectively perform as a lumped ESD protection device during an ESD discharge event because the on-chip or package transmission line delay is very small (about 10 ps for a 1.5 mm line) compared to the external turn-on time constants. For the Human Body Model the turn-on time constant is set by the external resistor through which the voltage is injected and the device capacitance. The RC turn-on time constant of the human body is typically approximately 2 ns. Similarly, for the Charged Device Model the time constant is set by the external inductance and the device capacitance that is coupled in series between a device pin and ground. The ESD pulse in the Charged Device Model is typically approximately 500 ps.

A long line length in the ESD protection circuit is, for example, 1.5 mm. The signal transmission time for a 1.5 mm line is approximately 10 ps. Because the 2 ns time constant for the Human Body Model and the 500 ps time constant for the Charged Device Model are so much longer than the 10 ps signal transmission time of the ESD protection circuit, the ESD protection circuit functions as a lumped device during the ESD event. By contrast for high frequency signals ESD protection circuit 240 performs like a transmission line. Thus the ESD protection circuit of the present invention provides the required ESD protection at low frequencies characteristic of ESD discharge events, and provides the high performance required by high frequency applications. Because the present invention enables the separation of the large capacitance requirement for protection, and a small capacitance for high frequency operation, it can be applied to a wide range of types of ESD protection.

Figure 3A:
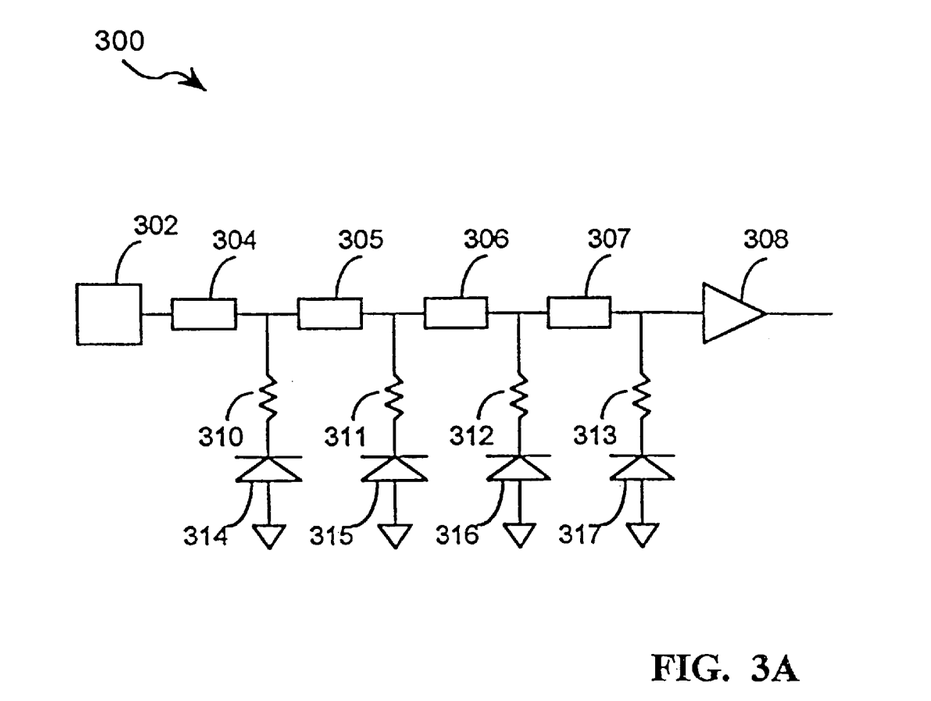
FIG. 3A illustrates a distributed ESD protection circuit 300 that uses a resistor in series with a diode as an ESD element according to another embodiment of the present invention.

FIG. 3A illustrates a distributed ESD protection circuit 300 that uses a resistor in series with a diode as an ESD element. Circuit 300 includes a pad 302, transmission line elements 304–307, device resistors, $R_d$, 310–313, diodes 314–317, and a buffer 308. Device resistors 310–313 can be used to distribute the current evenly between the devices. Referring to the line resistance associated with transmission line elements 304–307 as $R_s$, the ratio of $R_d$ to $R_s$ should be high to evenly distribute the current. Generally, the line resistance should be made small. Making the line resistance much smaller than the device resistance maximizes the ESD failure voltage. This is a general principle for ESD devices according to the present invention: the series metal resistance, $R_s$, should be much smaller than the effective total dynamic ESD device resistance during the ESD event.

Figure 3B:
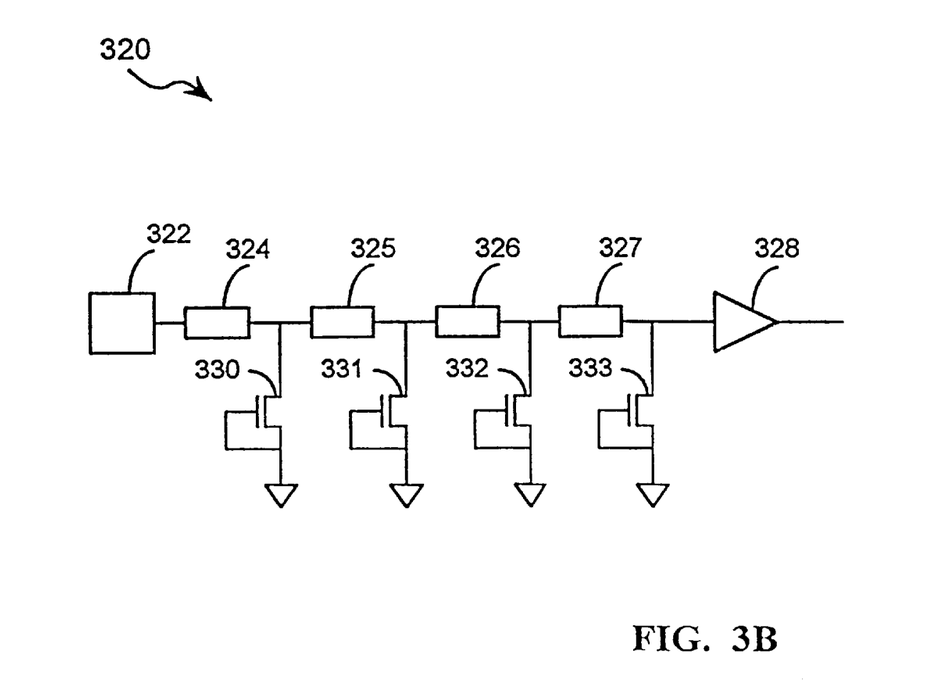
FIG. 3B illustrates a distributed ESD protection circuit 320 that uses thick field oxide transistors for ESD elements according to another embodiment of the present invention.

FIG. 3B illustrates a distributed ESD protection circuit 320 that uses thick field oxide transistors for ESD elements. Circuit 320 includes a pad 322, transmission line elements 324–327, diode configured NMOS transistors 330–333, and a buffer 328. As is known by those of ordinary skill in the art, MOS transistors have an associated parasitic diode and a parasitic bipolar transistor which can be used to conduct current during an ESD event. This is described in more detail in "Designing MOS Inputs and Outputs to Avoid Oxide Failure in the Charged Device Model," 1988 EOS/ESD Symposium, p. 220–227, which is hereby incorporated by reference. During an ESD event NMOS transistors 330–333 are placed into a snap-back mode in which the parasitic diode and/or NPN transistor associated with each of the NMOS transistors are turned on and the NMOS transistors conduct the ESD current from transmission line elements 324–327 to ground. All of the NMOS transistors 330–333 conducting current to ground in parallel provides a low resistance, high current path to ground and thereby protects the associated logic circuit from the high ESD voltage.

Figure 3C:
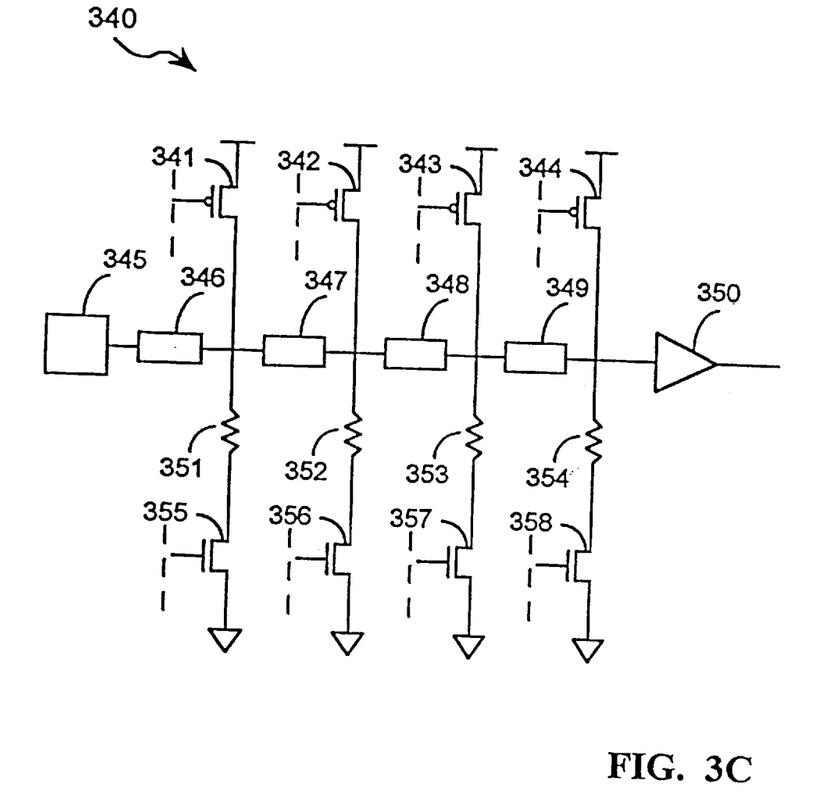
FIG. 3C illustrates a distributed CMOS driver ESD protection circuit 340 according to a further embodiment of the present invention.

FIG. 3C illustrates a distributed CMOS driver ESD protection circuit 340. Circuit 340 includes a pad 345, PMOS pull-up transistors 341–344, transmission line elements 346–349; resistors 351–354, NMOS pull-down transistors 355–358, and a buffer 350. The gates of each of the MOS transistors 341–344 and 355–358 are coupled to logic circuitry which is not shown as indicated by the dashed line at each of the gates. In a functional mode of the device, the logic circuitry controls whether the output drivers are in a pull-up mode, or a pull-down mode. Similar to circuit 320 in FIG. 3B, during an ESD event, depending upon the polarity of the ESD voltage, NMOS transistors 355–358 or PMOS transistors 341–344 are placed into a snap-back mode and the parasitic diode and/or bipolar transistor associated with these transistors conduct the ESD current to ground or the power supply which protects the logic circuitry from the ESD voltage.

Figure 3D:
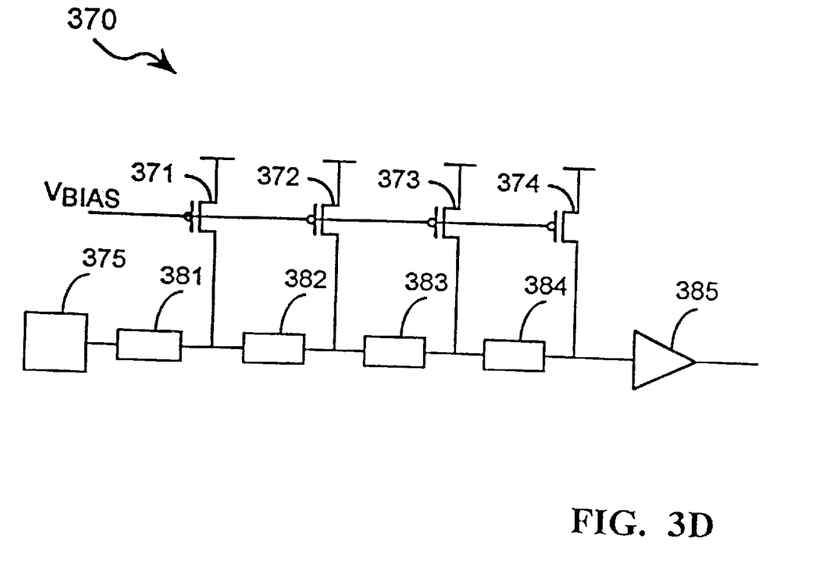
FIG. 3D illustrates a distributed MOS terminator ESD protection circuit 370 according to still another embodiment of the present invention.

FIG. 3D illustrates a distributed MOS terminator ESD protection circuit 370. Circuit 370 includes a pad 375, PMOS pull-up transistors 371–374, transmission line elements 381–384, and a buffer 385. In high speed circuits it is useful to have a buffer circuit with termination. PMOS transistors 371–374 provide a high speed termination from the transmission line elements 381–384 to a power supply. During operation of the IC PMOS pull-up transistors 371–374 should be biased so that the total resistance of the transistors matches the impedance, $Z_o$, of an external line coupled to pad 375 to provide a high bandwidth signal path. During an ESD event the parasitic diode and/or PNP transistor formed by each of the PMOS transistors 371–374 conduct the ESD current to the power supply. An alternative embodiment uses NMOS pull-down transistors coupled to ground instead of PMOS transistors 371–374 coupled to a power supply.

Figure 4A:
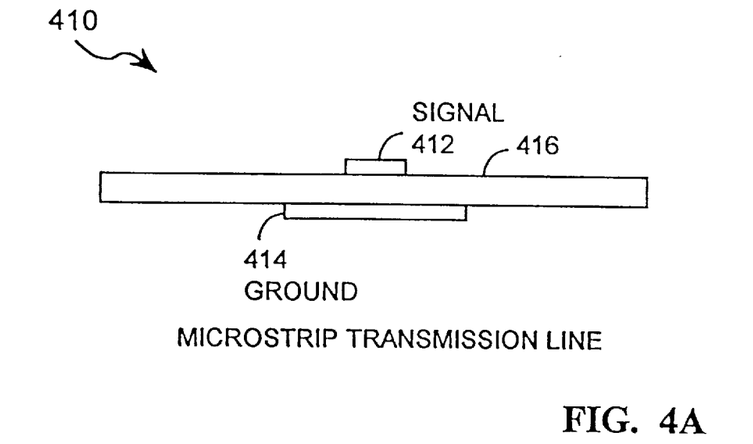
FIG. 4A illustrates a cross-section of a microstrip transmission line 410.
Figure 4B:
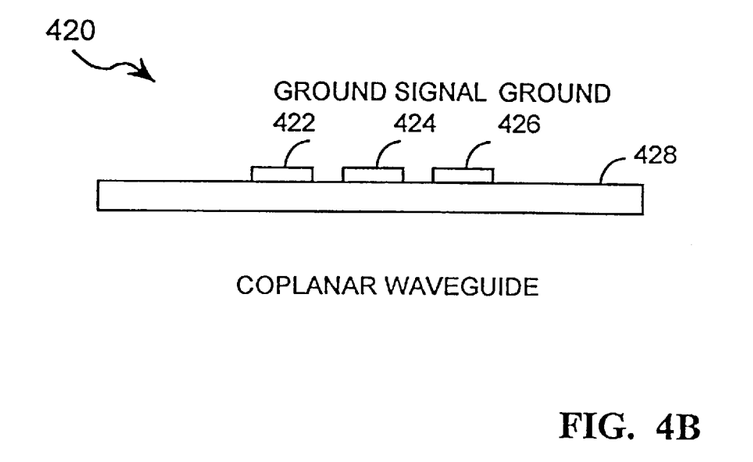
FIG. 4B illustrates a coplanar waveguide 420.
Figure 4C:
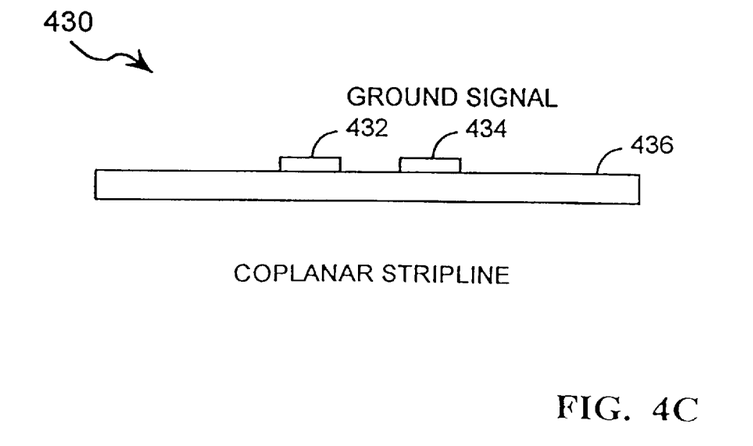
FIG. 4C illustrates a coplanar stripline 430.

FIGS. 4A–4C illustrate three types of transmission lines that can be used in distributed ESD protection circuits according to the present invention. FIG. 4A illustrates a cross-section of a microstrip transmission line 410. Microstrip transmission line 410 is comprised of a signal trace 412 placed above a ground plane 414, with a dielectric 416 between the two. FIG. 4B illustrates a coplanar waveguide 420. Coplanar waveguide 420 is comprised of a signal trace 424 with a ground trace 422 on one side and a second ground trace 426 on the other side, all of which are on a dielectric 428. FIG. 4C illustrates a coplanar stripline 430. Coplanar stripline 430 is comprised of a signal trace 434 and a ground trace 432 adjacent to the signal trace on a dielectric 436.

The impedance of the transmission lines is determined by the dimensions of the trace width and the separation between the traces, as well as the relative permittivity of the dielectrics. With the proper dimensions, each of the transmission lines illustrated in FIGS. 4A–4C can be designed to have larger than a 50 ohm impedance so that when the transmission line elements are coupled to ESD protection elements, the effective impedance of the ESD protection circuit is 50 ohms. Similarly, the transmission lines can be defined to match target impedances other than 50 ohms. The transmission lines can be fabricated as part of the IC die or the package. Transmission lines fabricated on an IC die should have sufficient separation between adjacent traces, and between traces and the substrate to avoid field oxide breakdown.

Figure 5:
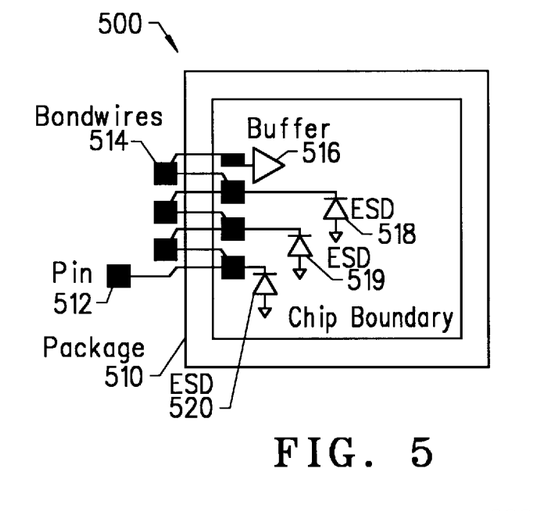
FIG. 5 illustrates a bondwire transmission line ESD protection circuit in an IC 500 according to an embodiment of the present invention.

FIG. 5 illustrates a bondwire transmission line ESD protection circuit in an IC 500. IC 500 includes IC package 510, external pin 512, bondwires 514, buffer 516 and ESD elements 518–520 represented as diodes. Bondwires 514 form a serpentine pattern coupling each ESD element 518–520 to a connection on the IC package 510. Bondwires 514 thereby provide a high impedance element between each of the capacitive ESD elements 518–520. Using package inductance is described in more detail in "An Integrated CMOS Distributed Amplifier Utilizing Package Inductance," IEEE Transactions on Microwave Theory and Techniques, Vol. 45, No. 10, October 1997, p. 1969–1976, which is hereby incorporated by reference.

Figure 6:
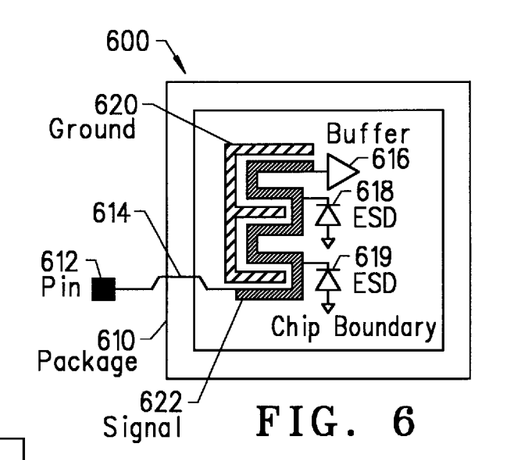
FIG. 6 illustrates an on-chip coplanar stripline ESD protection circuit in an IC 600 according to another embodiment of the present invention.

FIG. 6 illustrates an on-chip coplanar stripline ESD protection circuit in an IC 600. In the IC 600 ESD protection circuit the high impedance element between the ESD elements 618 and 619 is an on-chip coplanar stripline. The coplanar stripline is comprised of ground trace 620 and signal trace 622. Coplanar transmission lines as illustrated in FIGS. 4B and 4C can be used to make low-loss transmission lines with a high impedance on a chip. The coplanar strip line is serpentine shaped to minimize the space on the IC die used by the ESD protection circuit. In one embodiment a typical coplanar stripline length is on the order of 0.2–2 mm. Using a serpentine type pattern illustrated in FIG. 6, the ESD protection circuit can be fabricated using an area of no more than approximately 0.2 nmm×0.5 mm per pin with a state of the art manufacturing process. Advancements in semiconductor process technology will reduce the area used by the ESD protection circuit. Depending on the type of package 610 that is used, interconnect 614, that couples the external pin to the coplanar stripline, may be either a bondwire or a solder bump.

Figure 7:
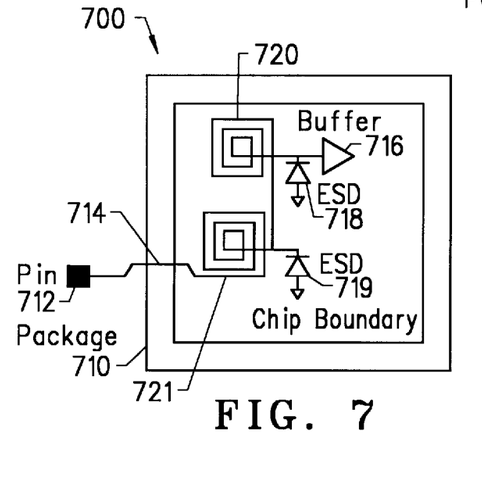
FIG. 7 illustrates an on-chip spiral inductor ESD protection circuit in an IC 700 according to a further embodiment of the present invention.

FIG. 7 illustrates an on-chip spiral inductor ESD protection circuit in an IC 700. In IC 700 the ESD protection circuit uses spiral inductors 720 and 721 instead of a transmission line to couple the ESD elements 718 and 719. Spiral inductors provide a higher impedance (inductance) than a transmission line. The larger impedance allows more capacitance per unit length to be used which reduces the total line length. In one embodiment the spiral inductors are fabricated on one metal layer with one trace. A second trace, on a second metal layer, couples a via from the center of the spiral to another element, in this case ESD elements 718 and 719. Generally, the larger the separation from the top level interconnect layer to the silicon substrate, and the smaller the via resistance the better the ESD protection circuit performance. The embodiments of FIGS. 5–7 can each be fabricated using standard CMOS bulk silicon processes.

One design criterion that should be considered in determining which of the above embodiments is best suited for a particular application is the maximum frequency of operation. Generally, the lengths of the segments between ESD elements should be less than approximately 10% of the wavelength of the maximum frequency of operation. For example, in a design with a 2 GHz maximum frequency, the wavelength in silicon dioxide is approximately 75 mm. Hence, the segment lengths should be less than about 7.5 mm. With this long of a maximum segment length, any of the embodiments in FIGS. 5–7 should provide adequate frequency response. However, for designs with a 20 GHz maximum frequency, the maximum segment length is less than approximately 0.75 mm. With this short of a segment length, package transmission line embodiments should use very short connections between the package and the IC die. One type of package that uses such very short connections is the C4 type package, which uses a solder bump to bond a pad on the package to a pad on the IC die. Alternatively, on chip transmission line embodiments, such as those illustrated in FIGS. 6 and 7 can be used. On-chip transmission line embodiments provide the additional advantage of protecting the device from ESD events which occur before the device is packaged. This advantage is particularly significant in manufacturing processes that use a known-good-die testing approach, as is used with some multi-chip modules, where the device may not be fully tested after it is placed in a package. As a result, ESD damage that occurs in a device before it is packaged but after the device is tested may go undetected.

Alternate Embodiments

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A high frequency electrostatic discharge (ESD) protection circuit for integrated circuits comprising:
   a plurality of serially connected distributed ESD components each component comprising:
      an input terminal;
      a ground terminal;
      an output terminal;
      an ESD element coupled between said ESD component output terminal and said ground terminal to couple ESD voltages applied to said ESD component input terminal to said ground terminal; and
      a high characteristic impedance transmission line segment coupled in series between said ESD component input terminal and said ESD component output terminal;
   an output terminal of a first ESD component coupled to an input terminal of a second ESD component to connect the high characteristic impedance transmission line segaments in series to form a transmission line whereby the ESD element capacitance is distributed along the transmission line to form with the high characteristic impedance line segments a wide bandwidth transmission line.

2. The circuit of claim 1 wherein said ESD element comprises a diode.

3. The circuit of claim 2 wherein said ESD element further comprises a resistor coupled in series with said diode.

4. The circuit of claim 1 wherein said ESD element comprises a MOS transistor.

5. The circuit of claim 4 wherein said ESD element further comprises a resistor coupled in series with said MOS transistor.

6. The circuit of claim 4 wherein said ESD component further comprises:
   a power supply terminal; and
   a PMOS transistor coupled in series between said ESD component output terminal and said power supply terminal.

7. The circuit of claim 1 wherein said ESD element comprises a thick field oxide MOS transistor.

8. A high frequency electrostatic discharge (ESD) protection circuit for integrated circuits comprising:
   a plurality of serially connected distributed ESD components each component comprising:
      an input terminal;
      a ground terminal;
      an output terminal;
      an ESD element coupled between said ESD component output terminal and said ground terminal to couple ESD voltages applied to said ESD component input terminal to said ground terminal; and a high characteristic impedance transmission line segment coupled in series between said ESD component input terminal and said ESD component output terminal, said high characteristic impedance transmission line segment being part of an integrated circuit package;

an output terminal of a first ESD component coupled to an input terminal of a second ESD component to connect the high characteristic impedance transmission line segments to form a transmission line whereby the ESD element capacitance is distributed along the transmission line to form with the high characteristic impedance line segments a wide bandwidth transmission line.

9. The circuit of claim 8 wherein said high characteristic impedance transmission line segment comprises a microstrip transmission line.

10. The circuit of claim 8 wherein said high characteristic impedance transmission line segment comprises a coplanar waveguide.

11. The circuit of claim 8 wherein said high characteristic impedance transmission line segment comprises a coplanar stripline.

12. The circuit of claim 8 wherein said high characteristic impedance transmission line segment comprises a bondwire configured to provide a predetermined inductance.

13. A high frequency electrostatic discharge (ESD) protection circuit for integrated circuits comprising:
a plurality of serially connected distributed ESD components each component comprising:
an input terminal;
a ground terminal;
an output terminal;
an ESD element coupled between said ESD component output terminal and said ground terminal to couple ESD voltages applied to said ESD component input terminal to said ground terminal, said ESD element being part of an integrated circuit die; and
a high characteristic impedance transmission line segment coupled in series between said ESD component input terminal and said ESD component output terminal, said high characteristic impedance transmission line segment being part of an integrated circuit die;

an output terminal of a first ESD component coupled to an input terminal of a second ESD component to connect the high characteristic impedance transmission line segments to form a transmission line whereby the ESD element capacitance is distributed along the transmission line to form with the high characteristic impedance line segments a wide bandwidth transmission line.

14. The circuit of claim 13 wherein said high characteristic impedance transmission line segment comprises a microstrip transmission line.

15. The circuit of claim 13 wherein said high characteristic impedance transmission line segment comprises a coplanar waveguide.

16. The circuit of claim 13 wherein said high characteristic impedance transmission line segment comprises a coplanar stripline.

17. The circuit of claim 13 wherein said high characteristic impedance transmission line segment comprises a spiral inductor formed by an integrated circuit trace.

18. A high frequency electrostatic discharge (ESD) protection circuit for integrated circuits comprising:
a plurality of serially connected distributed ESD components each component comprising:
an input terminal;
a power supply terminal;
an output terminal;
an ESD element coupled between said ESD component output terminal and said power supply terminal to couple ESD voltages applied to said ESD component input terminal to said power supply terminal; and
a high characteristic impedance transmission line segment coupled in series between said ESD component input terminal and said ESD component output terminal;

an output terminal of a first ESD component coupled to an input terminal of a second ESD component to connect the high characteristic impedance transmission line segments to form a transmission line whereby the ESD element capacitance is distributed along the transmission line to form with the high characteristic impedance line segments a wide bandwidth transmission line.

19. The circuit of claim 18 wherein said ESD element comprises a PMOS transistor, and wherein said high characteristic impedance transmission line segment comprises a transmission line.

20. A circuit for protecting an integrated circuit against electrostatic discharge comprising:
a transmission line coupled to said integrated circuit to apply or receive high frequency signals to or from said integrated circuit, and
a plurality of electrostatic discharge elements distributed along and coupled to said line to bypass any electrostatic discharge whereby said integrated circuit is not subjected to the electrostatic discharge and the capacitance of the electrostatic discharge elements is distributed along the transmission line to form therewith a wide bandwidth transmission line.

21. A circuit as in claim 20 in which the electrostatic discharge elements are PMOS pull-up transistors which bypass the electrostatic discharge to an associated power supply.

* * * * *